United States Patent
Marth et al.

(10) Patent No.: US 11,303,226 B2
(45) Date of Patent: Apr. 12, 2022

(54) METHOD FOR ACTIVATING AN ELECTROMECHANICAL ELEMENT

(71) Applicant: Physik Instrumente GmbH & Co. KG, Karlsruhe (DE)

(72) Inventors: Harry Marth, Waldbronn (DE); Jonas Reiser, Waldbronn (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 969 days.

(21) Appl. No.: 15/769,971

(22) PCT Filed: Oct. 20, 2016

(86) PCT No.: PCT/DE2016/100490
§ 371 (c)(1),
(2) Date: Apr. 20, 2018

(87) PCT Pub. No.: WO2017/067544
PCT Pub. Date: Apr. 27, 2017

(65) Prior Publication Data
US 2018/0316285 A1  Nov. 1, 2018

(30) Foreign Application Priority Data
Oct. 20, 2015  (DE) .................... 10 2015 013 553.8

(51) Int. Cl.
*H02N 2/06* (2006.01)
*H01L 41/04* (2006.01)
*H02N 2/04* (2006.01)

(52) U.S. Cl.
CPC .......... *H02N 2/067* (2013.01); *H01L 41/042* (2013.01); *H02N 2/043* (2013.01); *H02N 2/062* (2013.01)

(58) Field of Classification Search
CPC ......... H02N 2/067; H02N 2/043; H02N 2/062
(Continued)

(56) References Cited

U.S. PATENT DOCUMENTS

| 5,466,985 A * | 11/1995 | Suzuki | H01L 41/042 310/317 |
| 8,138,658 B2 | 3/2012 | Kushnir et al. | |
| 2010/0320868 A1* | 12/2010 | Kushnir | H01L 41/0536 310/317 |

FOREIGN PATENT DOCUMENTS

| DE | 10028335 | 2/2002 |
| DE | 102004009140 | 9/2005 |

(Continued)

OTHER PUBLICATIONS

Kushnir U. et al., "Advanced Piezoelectric-Ferroelectric Stack Actuator", Sensors and Actuators A: Physical, Elsevier B.V., NL, vol. 150, No. 1, Mar. 16, 2009, pp. 102-109.

(Continued)

*Primary Examiner* — Derek J Rosenau
(74) *Attorney, Agent, or Firm* — Finch & Maloney PLLC

(57) ABSTRACT

The invention relates to a method for activating at least one portion, to be specific a change portion, of an electromechanical element (3), comprising the following steps: providing an electromechanical element, wherein at least the change portion has at least two electrodes, which are spaced apart from one another, and arranged between the electrodes a polycrystalline and ferroelectric or ferroelectric-piezoelectric material with a multiplicity of domains, wherein, in an initial state, at least some of the domains have directions of polarization that are different from one another; generating an electrical field between the electrodes of the change portion by applying an electrical voltage in the form of at least one voltage pulse with a defined amplitude and a defined duration; transforming some of the domains with directions of polarization that are different from one another into a state of the same direction of polarization as a result of the at least one voltage pulse, and thereby producing an increase in the extent of the electromechanical element (Continued)

Figure 1:
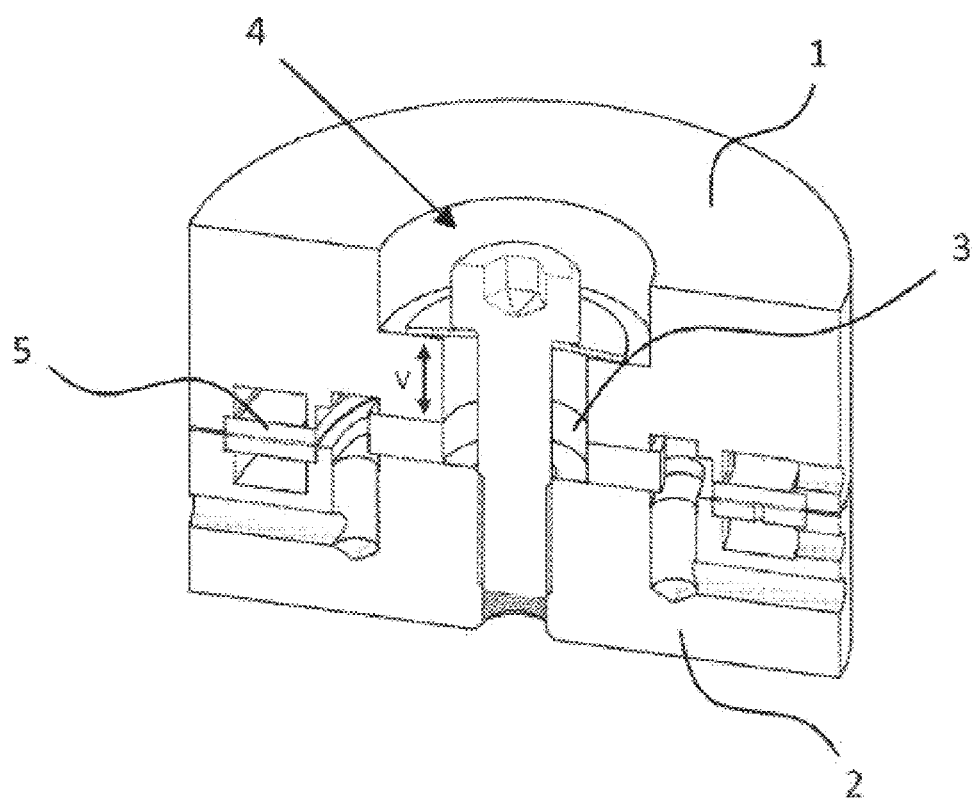

along a direction of extent V that is defined and persists without the presence of an electrical voltage, or transforming some of the domains with the same direction of polarization into a state with directions of polarization that differ from one another as a result of the at least one voltage pulse, and thereby producing a decrease in the extent of the electromechanical element along the direction of extent V that is defined and persists without the presence of an electrical voltage. The invention also relates to the use of an electromechanical element activated by this method as an adjusting element and to the arrangement of an electromechanical element activated by this method between two elements (1, 2) that are to be moved with respect to one another.

18 Claims, 8 Drawing Sheets

(58) Field of Classification Search
USPC .......................................................... 310/317
See application file for complete search history.

(56) References Cited

FOREIGN PATENT DOCUMENTS

| DE | 102004021955 | 12/2005 |
|----|--------------|---------|
| JP | S611278 | 1/1986 |

OTHER PUBLICATIONS

PCT Search Report for PCT Application No. PCT/DE2016/100490 dated Feb. 14, 2017, 3 pages.

* cited by examiner

METHOD FOR ACTIVATING AN ELECTROMECHANICAL ELEMENT

RELATED APPLICATIONS

This application claims priority under 35 U.S.C. § 371 as a national stage application of PCT Application No. PCT/DE2016/100490, filed Oct. 20, 2016, which claims priority to DE 102015013553.8, filed Oct. 20, 2015, each of which is hereby incorporated herein by reference in its entirety.

The invention relates to a method for controlling an electromechanical element and the use of an electromechanical element controlled by such a method as an adjustment element.

From U.S. Pat. No. 8,138,658 B2 an actuator with several layers of a piezoelectric-ferroelectric material is known in which a defined electric field can be selectively applied to individual layers, in order to utilize the non-linear effect of the ferroelectric component by converting from a completely un-polarized domain state into a fully polarized domain state, or vice versa, i.e. by a domain folding. By said domain folding, discontinuous deformation changes, i.e. deformation jumps can be achieved in these layers, while the utilization of the piezoelectric effect in the further layers of the actuator leads to a linear and continuous deformation change. Overall, this results in an actuator with an extended adjustment travel range. A further advantage is that the deformations of the actuator generated by domain folding remain even without applying an external voltage.

A disadvantage of the actuator known from U.S. Pat. No. 8,138,658 B2 is the generation of deformation jumps, so that this actuator cannot be used for very fine adjustment movements or can be used only with very high control effort.

The invention is therefore based on the object of providing a method for controlling at least one section of an electromechanical element, namely a change section, which makes the same suitable for very fine and defined adjustment movements, wherein the deformations of the changing section generated by application of electric fields remain even after removal the corresponding electric fields.

This object is achieved by the method according to claim 1, wherein the subsequent sub-claims represent at least further embodiments.

Accordingly, the basis is a method for controlling at least a portion of an electromechanical element, wherein the corresponding portion defines a change section. It should be emphasized at this point that the change section can also comprise the complete electromechanical element. In other words, the invention includes that the complete electromechanical element corresponds to the change section, and the complete electromechanical element is activated by the method according to the invention.

The method according to the invention comprises the following steps: providing an electromechanical element, wherein at least the change section comprises at least two electrodes spaced apart from each other and a polycrystalline and ferroelectric or ferroelectric-piezoelectric material with a plurality of domains disposed between the electrodes, wherein in an initial state at least a part of the domains comprises polarization directions which differ from each other; generating an electric field between the electrodes of the change section by applying an electrical voltage in the form of at least one voltage pulse having a defined amplitude and a defined duration; transferring a part of the domains with polarization directions which diverge from each other into a state with the same polarization direction due to the at least one voltage pulse and thereby generating a defined and without the presence of electrical voltage remaining increase in the extension of the change section of the electromechanical element along a direction of extension V, or transferring a part of the domains with the same polarization directions into a state with polarization directions which diverge from each due to the at least one voltage pulse and thereby generating a defined and without the presence of electrical voltage remaining decrease in the extension of the change section of the electromechanical element along a direction of extension V.

The term "electromechanical element" as used herein refers in the most general sense to an element in which, due to the action of an electrical voltage or the action of an electric field, a mechanical reaction, for example an extension change, which in turn can be used, for example, for an actuation movement, is provocative. At the same time, the term refers in the most general sense to an element in which in a reverse manner a mechanical action, for example the application of a compressive force, causes the generation of an electric field or an electrical voltage.

The term "domain" as used herein refers to a portion of a polycrystalline and ferroelectric or ferroelectric-piezoelectric material in which an identical or nearly identical direction of polarization is present.

The term "extension direction V", referred to above, describes the direction of the magnitude-largest and extension of the electromechanical element which is usable for the specific application.

Depending on the amplitude and the duration of the voltage pulse, the polarization state is permanently changed by the at least one voltage pulse at a smaller or larger part of the domains, so that defined and lasting deformation changes of the change section of the electromechanical element result. If in this case the corresponding domains with different polarization direction are converted into a state of the same polarization direction, the result is an enlarged extension of the change section of the electromechanical element along the extension direction V, while the conversion of domains with the same polarization direction into a state of different polarization direction leads to a decrease in the extension of the changing portion of the electromechanical element along the extension direction V leads.

It may be advantageous that the duration of a voltage pulse is between 50 and 150 ms, and preferably between 70 and 120 ms.

In this case, it may be advantageous for the duration of the rise section of a voltage pulse and the duration of the drop section of a voltage pulse to be between 5 and 20 ms, and preferably between 8 and 12 ms.

It can also be advantageous that after the step of providing an electromechanical element and before the step of generating an electric field between the electrodes of the change section by applying an electrical voltage in the form of at least one voltage pulse, an additional step for generating a defined initial extension of the change section is carried out, in which such electrical voltage or voltages are applied to the electrodes of the change section, after which a maximum extension increase corresponding to a polarization degree of 100% and/or a maximum extension decrease corresponding to a degree of polarization of 0% of the change section result/results, with the difference between the maximum extension increase and the maximum extension decrease defining the maximum possible extension change range.

It may also be an advantage that with an intended extension change of less than 50% of the maximum extension change range, such an electrical voltage is applied to the electrodes of the change section that a polarization degree of 0% results, and with an intended extension change of more than 50% of the maximum extension change range, such an electric voltage is applied to the electrodes of the change section that a degree of polarization of 100% results.

It may furthermore be advantageous to provide an electromechanical element in which, in the initial state, the material of the change section has a degree of polarization between 40% and 60%, and particularly preferably a degree of polarization of 50%. With degree of polarization in this case the proportion of the domains of the material of the change section of the electromechanical element is designated, which have a same polarization direction. By the corresponding polarization of the material of the change section of the electromechanical element in its initial state, it is possible to realize a decrease in the extension of the change section of the electromechanical element along the extension direction V already from the initial state by reducing the number of domains of the same polarization direction.

In addition, it may be advantageous that the amplitude of the voltage pulses for a defined increase in the extension of the change section of the electromechanical element along the extension direction V is dimensioned such that a resulting electric field strength between adjacent electrodes is between 50% and 200% of the coercive field strength. In this case, the larger the duration and/or the greater the number of voltage pulses applied, the smaller the smaller the corresponding amplitude can be, and vice versa, the corresponding amplification can be larger, the smaller the duration and/or the number of applied voltage pulses is. By coercive field strength is meant the field strength that is sufficient to satisfy either all of the dipole moments of the domains of a ferroelectric material in the field direction (saturation polarization) or to reduce the polarization to zero.

Furthermore, it may be advantageous for the amplitude of the voltage pulses for a defined decrease in the extension of the change section of the electromechanical element along the extension direction V to be dimensioned such that the resulting electric field strength between adjacent electrodes is between 10% and 90% of the coercive field strength. Here, too, the larger the duration and/or the larger the number of applied voltage pulses, the smaller the amplitude may be, and vice versa corresponding amplification be larger, the smaller the duration and/or the number of applied voltage pulses.

In addition, it may be advantageous for a first voltage pulse to be followed by a second voltage pulse, the second voltage pulse having a polarity that is different from the first voltage pulse.

Moreover, it may be advantageous for the amplitude of the second voltage pulse to be different from the amplitude of the first one voltage pulse, and preferably the amplitude of the second voltage pulse is smaller in magnitude than the amplitude of the first voltage pulse.

The invention also relates to the use of a controlled electromechanical element according to the method described above as an actuation element.

In addition, the invention relates to the arrangement of an electromechanical driven element according to the method described above between two elements to be moved against each other.

In this case, it may be advantageous that a further electromechanical element, preferably a piezoelectric actuator, is arranged between the electromechanical element controlled by the method according to the invention and one of the two elements to be moved relative to one another.

Likewise, however, it is conceivable that an electromechanical element has two different sections, one of which is the change section, which is controlled by the method according to the invention, while the remaining part—which then corresponds to the further electromechanical element or the piezoelectric actuator in the sense of the above—represents a conventional actuator.

Figure 2:
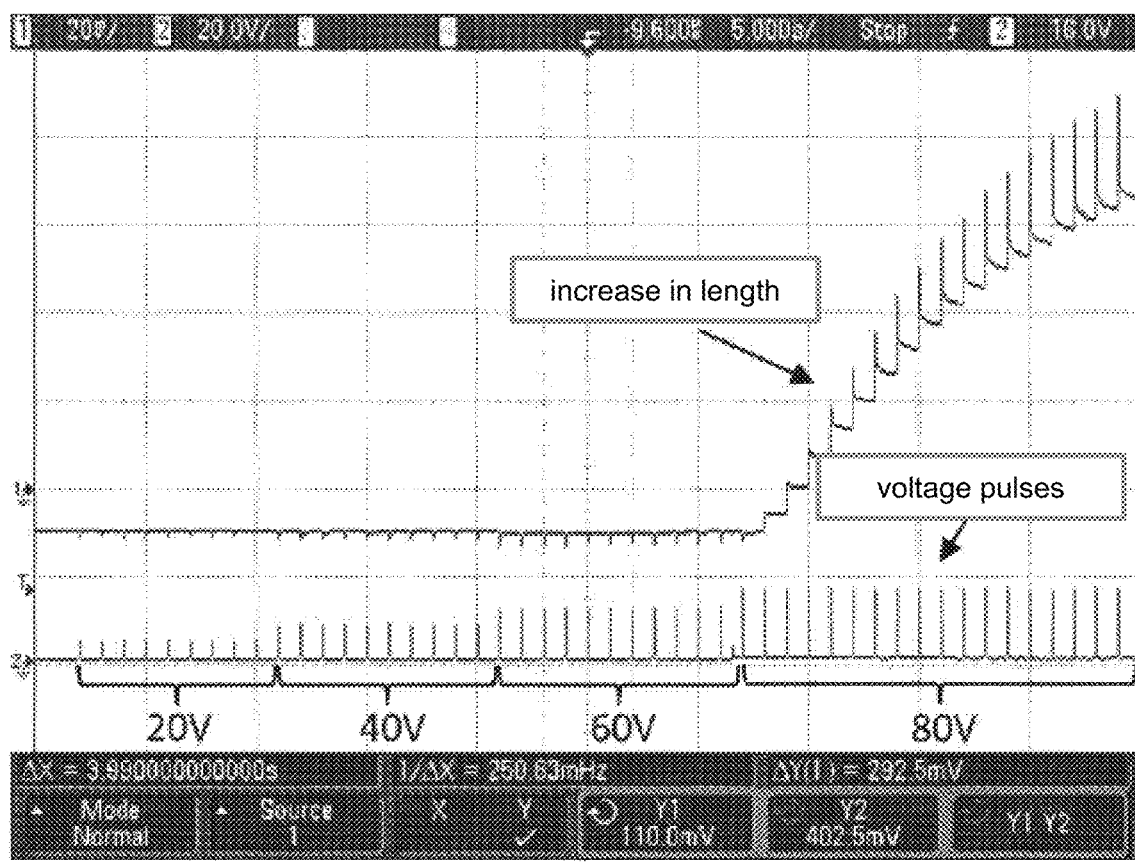
Figure 3:
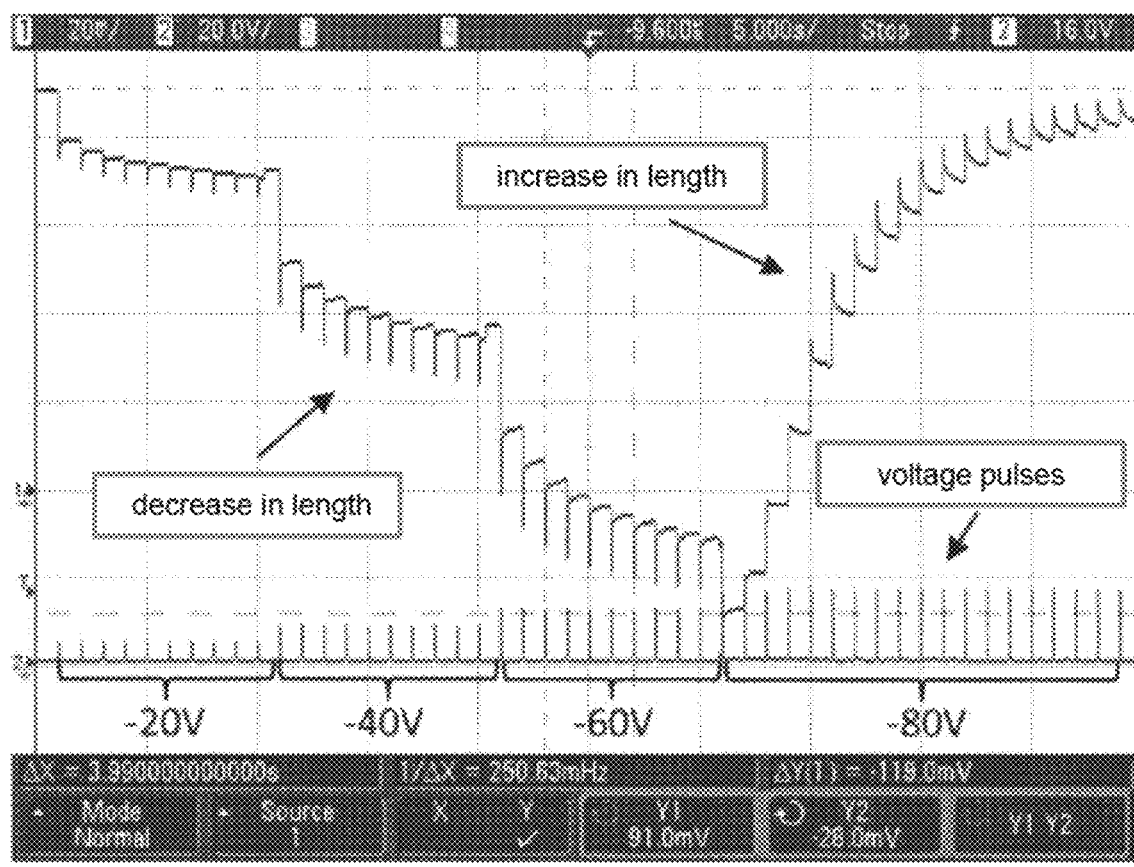
Figure 4:
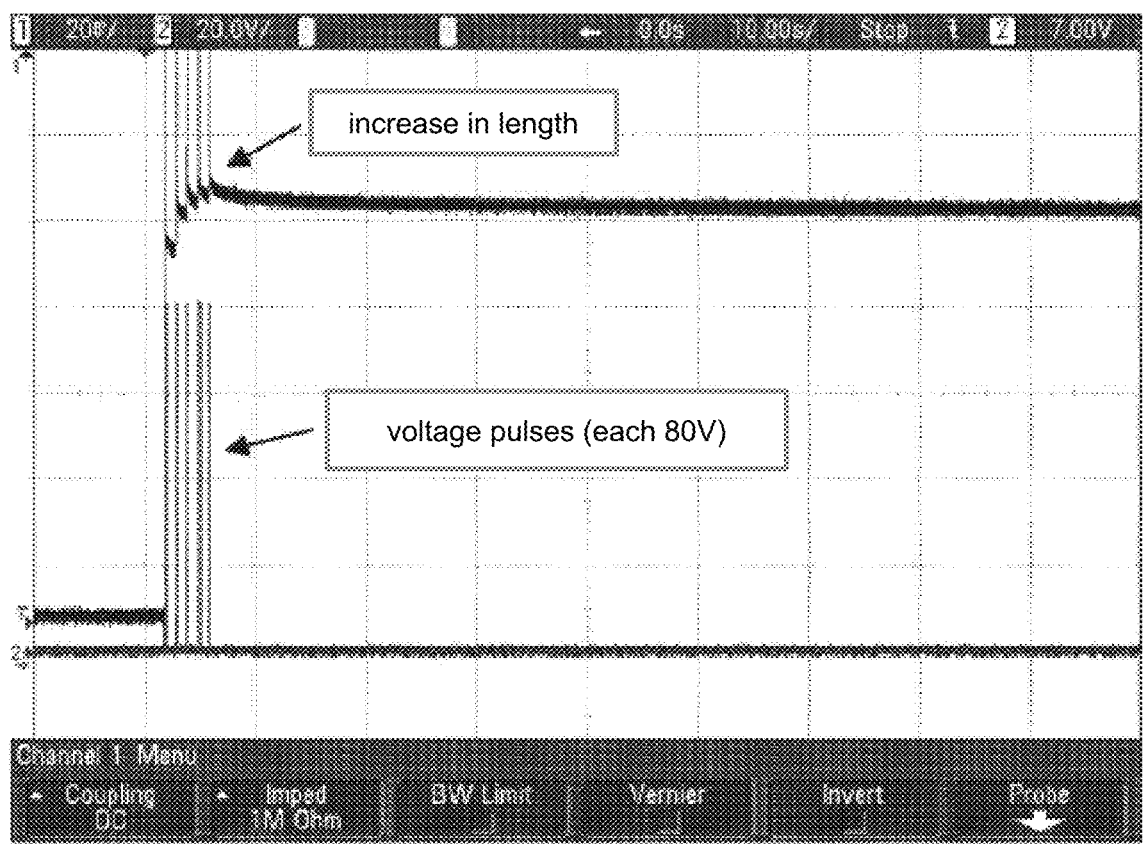
Figure 5:
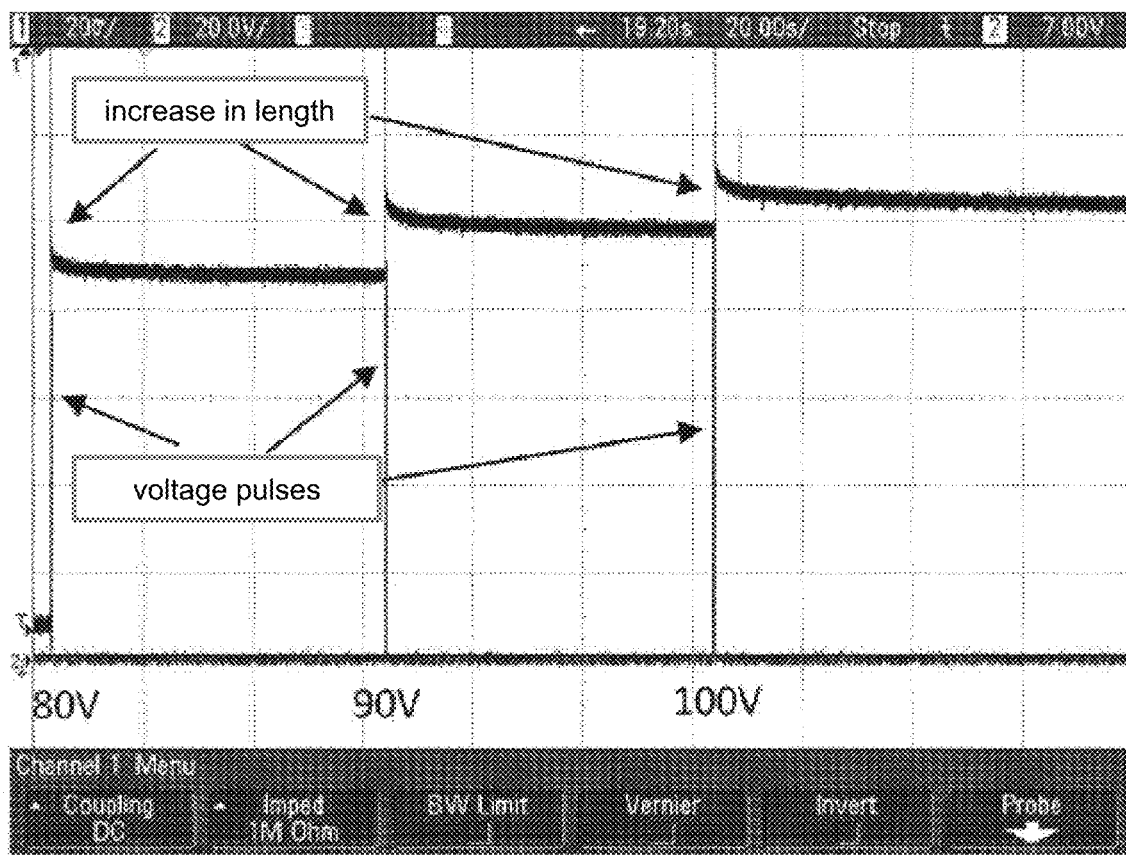
Figure 6:
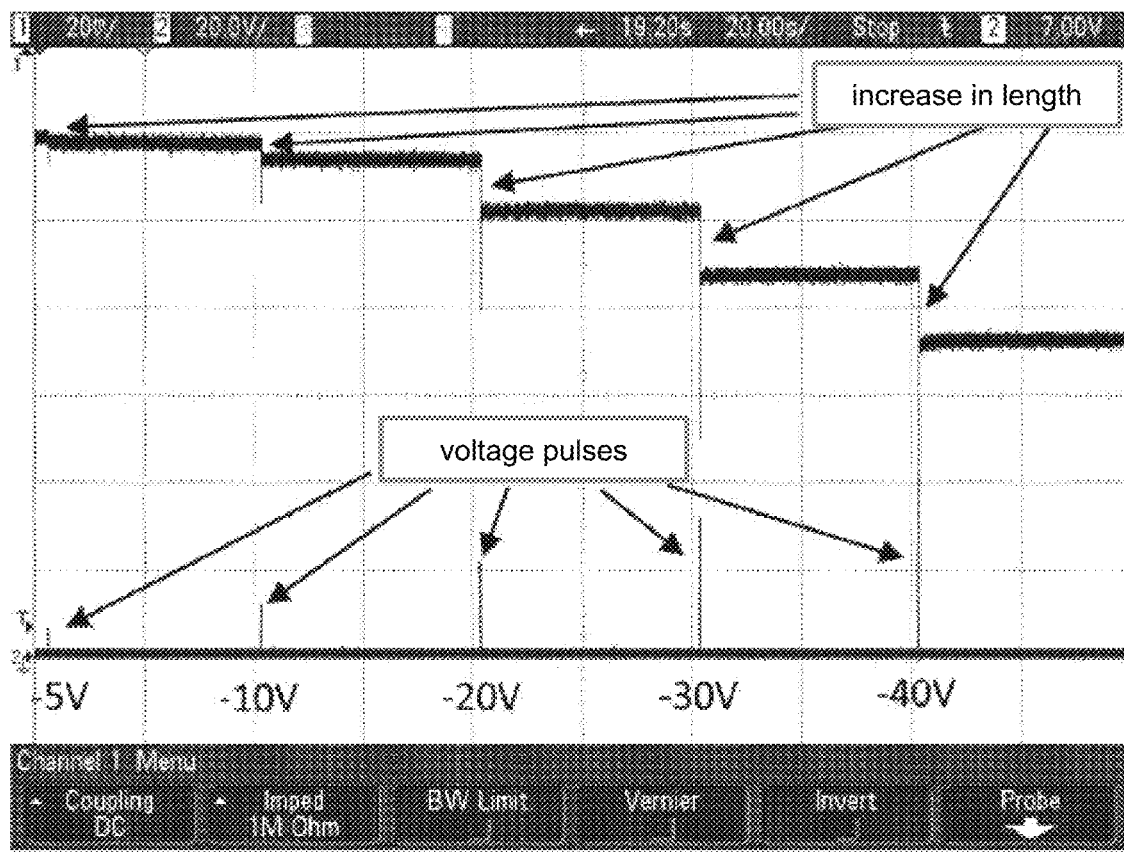
Figure 7:
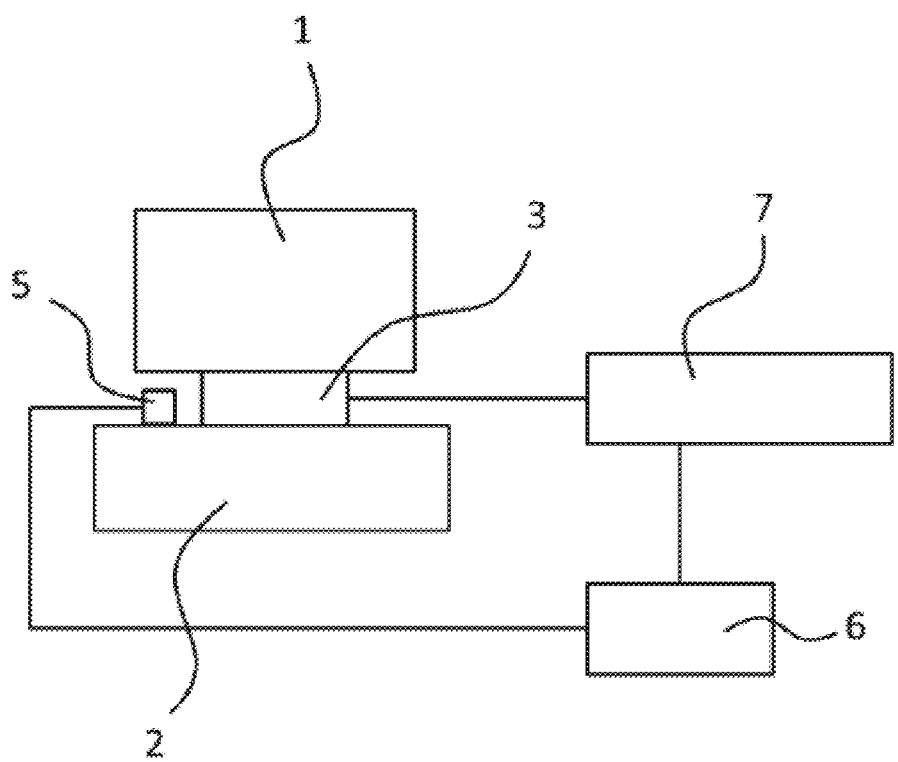
Figure 8:
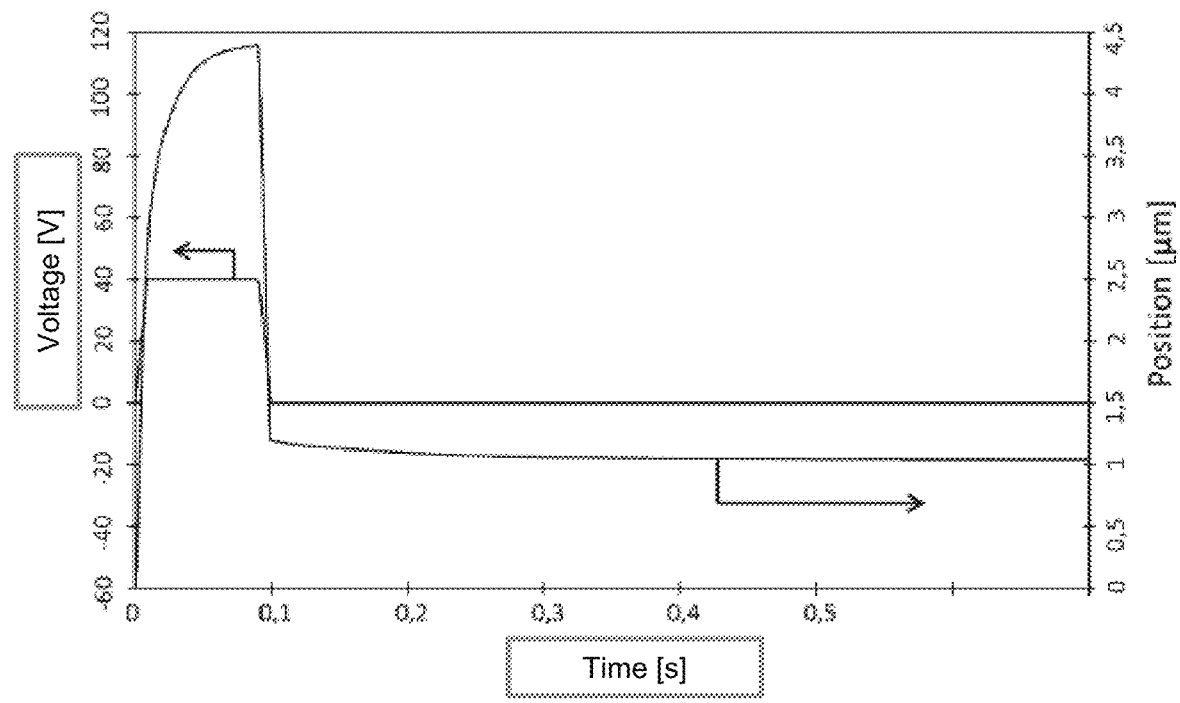
Figure 9:
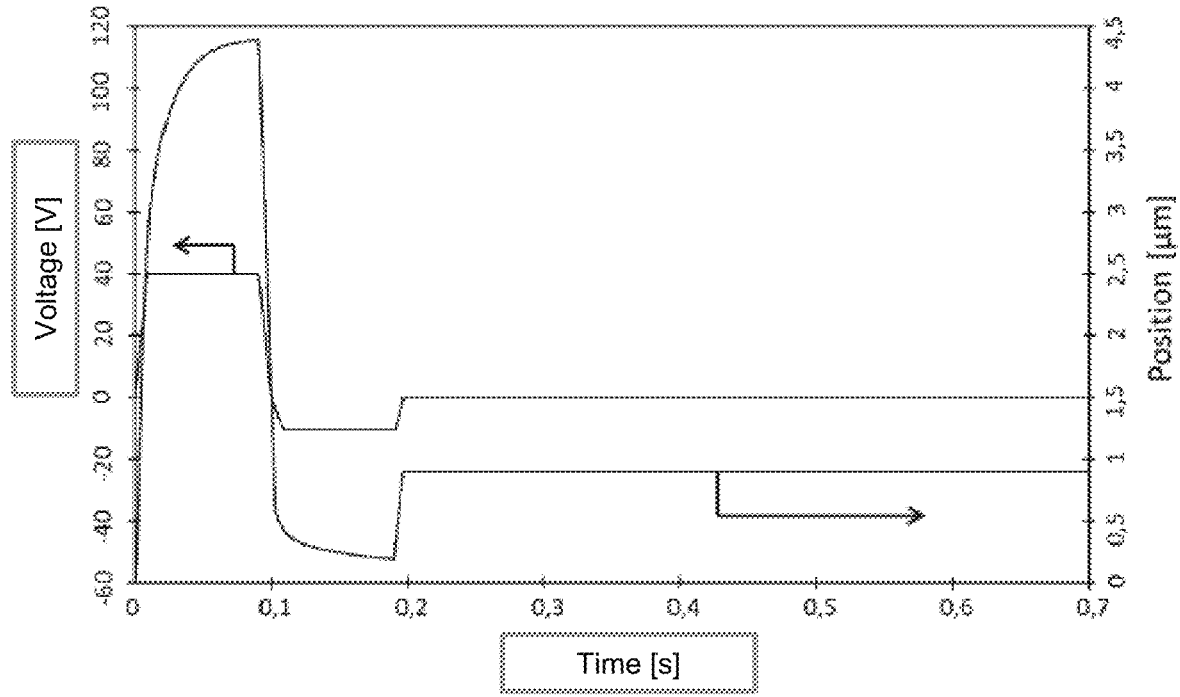

The figures show:

FIG. 1: Experimental setup for determining the extension or thickness change of an electromechanical element using the method according to the invention;

FIG. 2: Extension or thickness increase of the electromechanical element according to experimental setup of FIG. 1 when using the method according to the invention using multiple voltage pulses of the same duration and different positive electrical voltages;

FIG. 3: Extension or thickness decrease of the electromechanical element according to experimental setup of FIG. 1 when using the method according to the invention using multiple voltage pulses of the same duration and different negative electrical voltages;

FIG. 4: Extension or thickness increase and position stability of the electromechanical element according to the experimental setup of FIG. 1 when using the method according to the invention using multiple voltage pulses of the same duration and the same positive electrical voltage;

FIG. 5: Extension or thickness increase and position stability of the electromechanical element according to the experimental setup of FIG. 1 when using the method according to the invention using simple voltage pulses of the same duration and different positive electrical voltage;

FIG. 6: Extension or thickness decrease and position stability of the electromechanical element according to experimental setup of FIG. 1 when using the method according to the invention using simple voltage pulses of the same duration and different negative electrical voltages;

FIG. 7: Schematic representation of the use of an electromechanical element actuated by the inventive method as an actuator or its corresponding arrangement;

FIG. 8: Representation of the time profile of the extension change of an electromechanical element subjected to a single voltage pulse;

FIG. 9: Representation of the time profile of the extension change of an electromechanical element which is actuated upon by two successive voltage pulses of different polarity and amplitude FIG. 1 shows the experimental setup for determining the extension change behavior of an electromechanical element along an extension direction V using the method according to the invention. The change section of the electromechanical element in this case comprises the complete electromechanical element.

The electromechanical element 3 in the form of a ring with an outer diameter of 16 mm, an inner diameter of 8 mm and a thickness of 2.5 mm in this case consists of the piezoceramic material PIC252 the company PI Ceramic GmbH, Thuringia. This piezoceramic material has a coercive field strength of 1.1 kV/mm. The extension direction V corresponds to the direction of the thickness extension of the electromechanical element.

The electromechanical element 3 has a plurality of layers of piezoceramic material, wherein the individual layers are separated by interposed electrodes (so-called multilayer structure), and, in each case between two adjacent electrodes, the corresponding electrical voltage for forming the desired electric field within the piezoceramic material can be applied. The stacking direction of the layers of piezoceramic material and the electrodes arranged therebetween is in the direction of the thickness extension of the electromechanical element. The extension direction V thus runs substantially perpendicular to the electrodes. However, it is also conceivable that the extension direction V of the electromechanical element is parallel to the electrodes.

In addition to the above-described multilayer structure for the electromechanical element, a structure is also possible in which electrodes are arranged only on the outer sides of the electromechanical element, and accordingly only the material with electromechanical properties is located between the electrodes.

The electromechanical element 3 is firmly clamped between the base plate 2 and the movable plate 1 by means of a biasing device 4 consisting of a screw screwed into the thread of the base plate and a plate spring, which is arranged between screw head and movable plate, so that a biasing force of about 100 N results. Between the base plate and the movable plate, a capacitive measurement system 5 is provided for capturing their distance, this distance correlating with the extension change of the electromechanical element.

FIG. 2 shows measurement results obtained with the experimental setup according to FIG. 1 on the electromechanical element, which were determined at room temperature. In this case, on the one hand, the respective voltage pulses applied to the electromechanical element and, on the other hand, the corresponding extension changes of the electromechanical element are shown. The individual voltage pulses have a duration of 10 ms, and the frequency of the applied voltage pulses is 1 Hz.

The voltage pulses used in the laboratory experimental setup with a duration of 10 ms are rather disadvantageous for real applications, because the output stages of the corresponding voltage source usually have only limited output powers, and at such short pulse times very high currents must be provided, which optionally cannot be guaranteed from the power amplifiers. As practical for real applications, voltage pulses have a duration between 50 and 150 ms, preferably between 70 and 120 ms qualified, wherein the increase and decrease time on the flanks of the voltage pulses are best between 5 and 20 ms, and preferably between 8 and 12 ms.

For voltage pulses with an amplitude below a positive electrical voltage of 80 volts, there is no discernible extension or thickness change in the electromechanical element. Only at voltage pulses of +80 volts does a certain increase in extension or thickness take place with each individual pulse, which is greater at the initial pulses and decreases with increasing number of pulses.

In FIG. 2 it can be seen that at the beginning of each voltage pulse, a relatively large extension or thickness change takes place, but this initially decreases abruptly with termination of the voltage pulse, and decreases in direct connection over a longer period only very slightly. This extension behavior is due to the fact that initially, i.e. with the beginning of the voltage pulse, both a permanent and a labile reorientation of domains, as well as an excitation of the inverse piezoelectric effect takes place within the electromechanical element. Effectively usable here is only the permanent reorientation of the domains and the corresponding remanent extension. The term labile domain reorientation refers to the circumstance that the voltage pulse causes a certain number of domains to undergo a reorientation, but this is not stable, but only unstable, so that a reorientation into the previous state takes place. This process, called creep, takes some time so that the slower decrease in extension in this area can be explained.

The minus the creep process remaining increase in extension or thickness is therefore based on the lasting or permanent alignment of a certain number of dipoles in the individual domains of the piezoceramic material of the electromechanical element. With increasing number of applied voltage pulses with a voltage of +80 volts, the electromechanical element undergoes an increasing polarization, wherein this polarization causes a permanent or remanent strain, which remains even after removal of the electrical voltage.

FIG. 3 shows further measurement results obtained with the experimental setup according to FIG. 1 on the electromechanical element at room temperature, namely after performing the measurements according to FIG. 2. The initial state is accordingly an electromechanical element which is already enlarged in the extension along the extension direction V or in the thickness direction, to which in a first step pulses are applied with a low negative electrical voltage of −20 volts. Already this low electrical voltage is sufficient that the individual pulses cause an extension or thickness reduction of the electromechanical element, which is stronger with the initial pulses than in the subsequent pulses. This extension or thickness reduction is based on a partial depolarization of the piezoceramic material of the electromechanical element, so that in the individual domains already aligned dipoles are converted into a non-aligned state.

If the negative electrical voltage is further changed to −40 volts, there is a greater extension or thickness reduction or depolarization with each corresponding pulse, which is initially much stronger. Further change of the negative electrical voltage to −60 volts again results in an increased extension or thickness reduction compared to the two previously applied voltage pulses. When the voltage is set to −80 volts, so-called repolarization takes place in the domains of the piezoceramic material of the electromechanical element, resulting in spontaneous alignment of the dipoles in a direction opposite to the alignment direction of the previous depolarization. The pulses having a negative electrical voltage of −80 volts thereby cause successive steps of extension or thickness increase, which are similar to the steps of the extension or thickness increase in the application of the pulses with a positive electric voltage of +80 volts.

FIG. 4 shows measurement results on an electromechanical element according to the experimental setup in FIG. 1, wherein exactly five voltage pulses with a respective pulse duration of 10 ms, a pulse frequency of 1 Hz and an electrical voltage of +80 volts are applied to the electromechanical element at room temperature, and then the Voltage source is separated from the electromechanical element. After said separation of the voltage source from the electromechanical element retains this the correspondingly induced extension or thickness increase due to the corresponding polarization permanently and stably.

In FIG. 5, measurement results are shown, which were also determined on an electromechanical element according to the experimental setup in FIG. 1 at room temperature. In this case, successively three individual pulses are applied with a pulse duration of 10 ms each with different levels of positive electrical voltages on the electromechanical element with subsequent removal of the respective electrical voltage. The first voltage pulse with an amplitude of +80 volts results in a certain increase in extension or thickness or polarization, which remains after removal of the electrical voltage (remanent strain). The subsequent second voltage pulse with an amplitude of +90 volts results in an increase in extension or thickness, which is greater than in the first voltage pulse. Also, this increase in extension or thickness remains after removal of the electrical voltage. The third voltage pulse with an amplitude of +100 volts finally results in the largest increase in extension or thickness, but the difference to the extension increase at +90 volts is less than the corresponding difference between +80 volts and +90 volts. Even after removing the voltage of +100 volts, the corresponding strain remains remanent.

Immediately following the determination of the measurement results according to FIG. 5, pulses with different negative electrical voltages were applied to the same electromechanical element at room temperature and likewise using the experimental setup according to FIG. 1 with subsequent removal (see FIG. 6). Even at the very low voltage of −5 volts a slight depolarization with corresponding reduction in extension or thickness of the electromechanical element occurs, wherein the resulting extension or thickness change is permanent or remanent. This is analogous to the subsequent voltage pulses with amplitudes of −10 volts, −20 volts, −30 volts and −40 volts. In each case a permanent or remanent extension reduction or thickness reduction of the electromechanical element occurs, wherein the respective reduction is greater, the higher the negative voltage. This effect is particularly evident in the first four voltage pulses, while the difference in the extension change at −30 volts and −40 volts is only marginal.

FIG. 7 illustrates in a schematic representation on the one hand, the use of an electro-mechanical element driven according to the inventive method as a control element, and on the other hand, the corresponding arrangement of such an electromechanical element. As in FIG. 1, the entire electromechanical element represents the change portion of the electromechanical element.

The electromechanical element or the adjustment element 3 is in this case arranged between a stationary element in the form of the base plate 2 and an element to be moved relative to the base plate 2 in the form of the movable plate 1, wherein by means of a capacitive measurement system 5, the distance between the base plate 2 and the movable plate 1 is measured or controlled. The distance data thus obtained are transferred to a controller 6, which sends corresponding drive signals to the voltage source 7, and the voltage source 7, which is electrically connected to the adjustment element 3, acts on this either with a series of voltage pulses or only with a single voltage pulse, so that the desired position of the movable plate 1 due to a defined increase or decrease of the extension of the actuating element in an extension direction V, which is parallel to the adjustment direction of the movable plate 1, is approached. Then there is a separation of the electrical connection between the voltage source 7 and the adjustment element 3, wherein the adjustment element 3 permanently retains its extension change previously set and defined even without application of electrical voltage.

In addition to the so-described use of an electromechanical element controlled by the method according to the invention as an adjustment element in a controlled system, i.e. with the aid of a measurement system and the transfer of the corresponding measured values to a controller, it is also possible to use it as an adjustment element in an open-loop system. Applicant's experiments have shown that accuracies of about +/−3% can be achieved, with higher accuracies also appearing possible through optimization.

The use of an electromechanical element as an adjustment element which is controlled according to the method of the invention herewith allows adjusting movements with the smallest dimensions, wherein the dimension of the positioning movements is in particular depend on the height or the amplitude and the duration of the voltage pulses.

It is also an arrangement, in particular a series arrangement, of an electromechanical element controlled by the method according to the invention together with a conventional electromechanical element such as a piezoelectric actuator or piezoactuator conceivable, wherein the conventional piezoactuator maintains the corresponding extension only as long as an electrical voltage is applied thereto, while in the electromechanical element controlled according to the method of the invention, the extension increase or extension decrease is guaranteed even without application of an electrical voltage. The term "row arrangement" described above describes an arrangement in which the electromechanical element and the conventional piezoelectric actuator are arranged one behind the other, so that the conventional piezoelectric actuator is arranged between the electromechanical element and one of the elements to be moved relative to one another.

In addition to the previously described series arrangement of electromechanical element and conventional piezoelectric element, the invention provides that a single electromechanical element is present, in which a section, namely the change section, is driven by the method according to the invention, while the remaining part or section of the electromechanical element either has the same or different design as the changing portion, and this remaining part or portion of the electromechanical element is driven by a conventional method for driving an electromechanical element. For example, the remaining section or section of the electromechanical element is a piezoelectric material having at least two electrodes between which this piezoelectric material is disposed, wherein the piezoelectric material is completely polarized, and an extension which correlates to the applied voltage can be realized, which, however, with removal of the electrical voltage—in contrast to a change in extension of the change section—falls back to its original value. Thus, the remaining part or section of the electromechanical material is a conventional piezoelectric actuator.

The maximum possible extension of a conventional piezoelectric actuator, caused by the application of an electrical voltage, is about 1-2% o of its dimension in the extension direction without applied electrical voltage. In contrast, the maximum possible, without the action of an electrical voltage permanently existing extension in the extension direction of a controlled by the inventive method electromechanical element about 50-60% of the maximum possible extension of a conventional piezoelectric actuator (with the same structure of electromechanical element and conventional piezoelectric actuator).

FIG. 8 shows in a measuring diagram the variation with time of the change in extension of an electromechanical element subjected to a single voltage pulse according to the test arrangement of FIG. 1. The voltage pulse has an amplitude of 40 volts and a duration of 100 ms, the increase time and the decrease time of the flanks of the pulse have a duration of about 10 ms. With the onset of the voltage pulse, a rapid increase in extension of the electromechanical element by almost 4.5 mm occurs. This extension enlargement abruptly decreases with termination of the voltage pulse, wherein, with respect to the initial state, a residual strain of about 1.2μπη remains. In the further course, it can be seen that the remanent strain is not yet constant directly after the end of the voltage pulse, but over a certain period of time there is still a slight decrease in the extension. This is due to the fact that due to the voltage pulse in some domains although a reorientation took place, but the introduced energy is not sufficient for a permanent and lasting reorientation. There are foldback processes, which reverses the previously realized reorientation of the corresponding domains (creep process or creeping). Overall, this results in a slightly reduced extension change with the single voltage pulse.

In order to counteract the phenomenon of creeping described above, it is possible to apply a second voltage pulse directly after the first voltage pulse, wherein the second voltage pulse, however, has a reverse polarity as the first voltage pulse. FIG. 9 illustrates the effects that can be achieved by the second voltage pulse or counter-pulse on the basis of a measurement diagram, wherein identical measurement conditions otherwise exist compared to FIG. 8.

It can be seen from FIG. 9 that, with the first voltage pulse of positive polarity, an extension behavior with respect to the electromechanical element is achieved, as is already known from FIG. 8. By the subsequent second voltage pulse with negative polarity and the same duration, but lower amplitude than the first voltage pulse, in deviation to FIG. 8, a certain depolarization of the previously polarized material of the electromechanical element occurs, but this depolarization is low and essentially ensures that the fold back processes described with regard to FIG. 8 are significantly accelerated, so that no more creeping is to be measured on the electromechanical element. Ultimately, the remanent elongation of the electromechanical element is only slightly reduced by the counter-pulse compared to the otherwise identical measurement shown in FIG. 8, but with the decisive advantage that the remanent extension no longer experiences a time-dependent change and is stable.

It should be explicitly noted that the method according to the invention provides for both the application of a sequence of voltage pulses and the application of a single or only voltage pulse to achieve a desired extension of the electromechanical element.

The invention claimed is:

1. A method for controlling at least one section of an electromechanical element, wherein a corresponding section defines a change section, the method comprising:
   providing an electromechanical element, wherein at least the change section comprises at least two electrodes spaced apart from each other and a polycrystalline and ferroelectric or ferroelectric-piezoelectric material with a plurality of domains disposed between the electrodes, wherein in an initial state at least a part of the domains comprises polarization directions which differ from each other;
   generating an electric field between the electrodes of the change section by applying an electrical voltage in a form of at least one voltage pulse having a defined amplitude and a defined duration;
   generating a permanent change in the degree of polarization of the change section based on the amplitude and the duration of the at least one voltage pulse for a controlled permanent extension change of the change section of the adjusting element by
   transferring a part of the domains with polarization directions which diverge from each other into a state with a same polarization direction due to the at least one voltage pulse and thereby generating, without the presence of electrical voltage remaining, a defined increase in an extension of the change section of the electromechanical element along a direction of extension V, or
   transferring a part of the domains with a same polarization direction into a state with polarization directions which diverge from each other due to the at least one voltage pulse and thereby generating, without the presence of electrical voltage remaining, a defined decrease in the extension of the change section of the electromechanical element along the direction of extension V.

2. The method according to claim 1, wherein generating the electric field comprises generating an electric field between the electrodes of the change section by applying an electrical voltage in the form of at least one voltage pulse with a defined amplitude and a defined duration between 50 and 150 ms.

3. The method according to claim 1, further comprising generating, between providing the electromechanical element and generating the electric field, a defined initial extension of the change section at least in part by applying one or more electrical voltages to the electrodes of the change section, thereby generating one or both of (1) a maximum extension increase corresponding to a degree of polarization of 100% and (2) a maximum extension decrease corresponding to a polarization degree of 0%, wherein a difference between the maximum extension increase and the maximum extension decrease defines a maximum extension change range.

4. The method according to claim 3, further comprising applying voltage to the electrodes to either
   adjust the degree of polarization to 0%, thereby generating an intended extension change of less than 50% of the maximum extension change range, or
   adjust the degree of polarization to 100%, thereby generating an intended extension change of more than 50% of the maximum extension change range.

5. The method according to claim 1, wherein providing the electromechanical element comprises providing an electromechanical element with a change section comprising a material with a degree of polarization between 40% and 60% when in an initial state.

6. The method according to claim 1, wherein generating the electric field comprises dimensioning the defined amplitude to generate a field strength between adjacent electrodes of between 50% and 200% of a coercive field strength, thereby generating a defined increase in the extension of the change section of the electromechanical element along the extension direction V.

7. The method according to claim 1, wherein generating the electric field comprises dimensioning the defined amplitude to generate a field strength between adjacent electrodes of between 10% and 90% of a coercive field strength, thereby generating a defined decrease in the extension of the change section of the electromechanical element along the extension direction V.

8. The method according to claim 1, wherein generating the electric field comprises applying an electrical voltage in a form of a first voltage pulse with a first polarity followed by a second voltage pulse with a second polarity different from the first polarity.

9. The method according to claim 8, wherein applying the electrical voltage comprises applying an electrical voltage in a form of a first voltage pulse with a first amplitude and a second voltage pulse with a second amplitude different from the first amplitude.

10. Use of an electromechanical element controlled by the method according to claim 1 as an adjustment element.

11. An arrangement of an electromechanical element between two elements to be moved against each other, wherein at least one section of the electromechanical element is controlled by the method of claim 1.

12. The arrangement according to claim 11, wherein a further electromechanical element is arranged between the electromechanical element controlled by the method according to claim 1 and one of the two elements to be moved against each other.

13. The arrangement according to claim 12, wherein the further electromechanical element is a piezoelectric actuator.

14. The method according to claim 2, wherein generating the electric field comprises generating an electric field between the electrodes of the change section by applying an electrical voltage in the form of a voltage pulse with a defined amplitude and a defined duration between 70 and 120 ms.

15. The method according to claim 5, wherein providing the electromechanical element comprises providing an electromechanical element with a change section comprising a material with a degree of polarization of 50%, when in an initial state.

16. The method according to claim 9, wherein applying the electrical voltage comprises applying an electrical voltage in a form of a first voltage pulse with a first amplitude and a second voltage pulse with the second amplitude smaller in magnitude than the first amplitude.

17. The method according to claim 1, wherein the electric field is a first electric field and the at least one voltage pulse is a first voltage pulse, the method comprising:

generating a second electric field between the electrodes of the change section by applying an electrical voltage in a form of a second voltage pulse having a defined amplitude and a defined duration, wherein the first electric field causes, without the presence of electrical voltage remaining, a first increase or decrease in the extension of the change section of the electromechanical element along the direction of extension V, and wherein the second electric field causes, without the presence of electrical voltage remaining, a second increase above the first increase in the extension of the change section of the electromechanical element along the direction of extension V, or the second electric field causes, without the presence of electrical voltage remaining, a second decrease below the first decrease in the extension of the change section of the electromechanical element along the direction of extension V.

18. The method according to claim 17, wherein the second voltage pulse sequentially follows the first voltage pulse.

\* \* \* \* \*